(12) United States Patent
Sugizaki et al.

(10) Patent No.: US 9,166,069 B2
(45) Date of Patent: Oct. 20, 2015

(54) LIGHT RECEIVING CIRCUIT

(75) Inventors: Masayuki Sugizaki, Kanagawa-ken (JP); Shigeyuki Sakura, Kanagawa-ken (JP); Miki Hidaka, Fukuoka-ken (JP); Hiroshi Shimomura, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 13/601,388

(22) Filed: Aug. 31, 2012

(65) Prior Publication Data

US 2013/0193495 A1    Aug. 1, 2013

(30) Foreign Application Priority Data

Jan. 27, 2012   (JP) ................................. 2012-015535

(51) Int. Cl.
*H01L 31/00*   (2006.01)
*H01L 27/00*   (2006.01)
*H01L 31/02*   (2006.01)
*H03F 3/08*    (2006.01)

(52) U.S. Cl.
CPC .......... *H01L 31/02019* (2013.01); *H03F 3/082* (2013.01)

(58) Field of Classification Search
CPC ...................... H01L 2924/13055; H01L 27/14; H01L 27/14643; H01L 27/14679; H01L 27/14623; H01L 27/14612; H01L 27/14614; H01L 27/14616; H01L 31/0232; H01L 31/02016; H01L 31/02019; H03F 3/08; H03F 3/10; H03F 3/16
USPC .................................. 257/225–233, 290–293
See application file for complete search history.

(56) References Cited

U.S. PATENT DOCUMENTS

| | | | | |
|---|---|---|---|---|
| 4,227,098 A * | 10/1980 | Brown et al. | ................. | 307/117 |
| 5,013,926 A * | 5/1991 | Aizawa | ......................... | 250/551 |
| 5,045,709 A * | 9/1991 | Ogawa | ............................ | 250/551 |
| 5,270,904 A * | 12/1993 | Gulczynski | ..................... | 363/97 |
| 5,559,466 A * | 9/1996 | Okumura et al. | ............. | 327/514 |
| RE35,836 E * | 7/1998 | Rodriguez | .................... | 250/551 |
| 5,801,588 A * | 9/1998 | Nishiyama | .................... | 330/308 |
| 5,847,593 A * | 12/1998 | Pernyeszi | ...................... | 327/432 |
| 6,046,461 A | 4/2000 | Saitoh et al. | | |
| 6,219,166 B1 * | 4/2001 | Shang et al. | ................. | 398/202 |
| 6,496,070 B2 | 12/2002 | Kubota | | |

(Continued)

FOREIGN PATENT DOCUMENTS

| | | |
|---|---|---|
| JP | H09321548 A | 12/1997 |
| JP | 2000013330 A | 1/2000 |
| JP | 2001102911 A | 4/2001 |

(Continued)

OTHER PUBLICATIONS

Japanese Office Action dated Oct. 28, 2014, filed in Japanese counterpart Application No. 2012-015535, 3 pages (with translation).

*Primary Examiner* — Matthew W Such
*Assistant Examiner* — Stephen C Smith
(74) *Attorney, Agent, or Firm* — Patterson & Sheridan, LLP

(57) ABSTRACT

According to an embodiment, a light-receiving circuit includes a MOSFET, a first light-receiving element and a second light-receiving element. The first light-receiving element controls a state of the MOSFET between ON state and OFF state by applying a voltage induced by a light signal between a gate of the MOSFET and a source of the MOSFET; and a second light-receiving element controls a threshold voltage of the MOSFET.

14 Claims, 12 Drawing Sheets

(56) References Cited

U.S. PATENT DOCUMENTS

| | | | |
|---|---|---|---|
| 7,829,837 B2 * | 11/2010 | Takayanagi et al. | 250/214.1 |
| 2005/0128331 A1 * | 6/2005 | Yoshida et al. | 348/333.01 |

FOREIGN PATENT DOCUMENTS

| | | |
|---|---|---|
| JP | 2001358547 A | 12/2001 |
| JP | 2002026823 A | 1/2002 |
| JP | 2003115755 A | 4/2003 |
| JP | 2004356702 A | 12/2004 |
| JP | 2005167361 A | 6/2005 |
| JP | 2008098445 A | 4/2008 |

* cited by examiner

US 9,166,069 B2

LIGHT RECEIVING CIRCUIT

CROSS-REFERENCE TO RELATED APPLICATIONS

This application is based upon and claims the benefit of priority from Japanese Patent Application No. 2012-015535, filed on Jan. 27, 2012; the entire contents of which are incorporated herein by reference.

FIELD

Embodiments are generally related to a light receiving circuit.

BACKGROUND

There is a demand for a device that transfers signals using light, such as a photo-coupler or an optical data link, to reduce power consumption in the light-receiving circuit. For example, an analog receiver circuit which includes, at an input stage thereof, a light receiving element and a trans-impedance amplifier (TIA) consumes much power since current flows while inputting no signal. In contrast, a digital circuit made up of metal-oxide-semiconductor field-effect transistors (MOSFET) enables power consumption to be reduced.

DETAILED DESCRIPTION

Figure 1A:
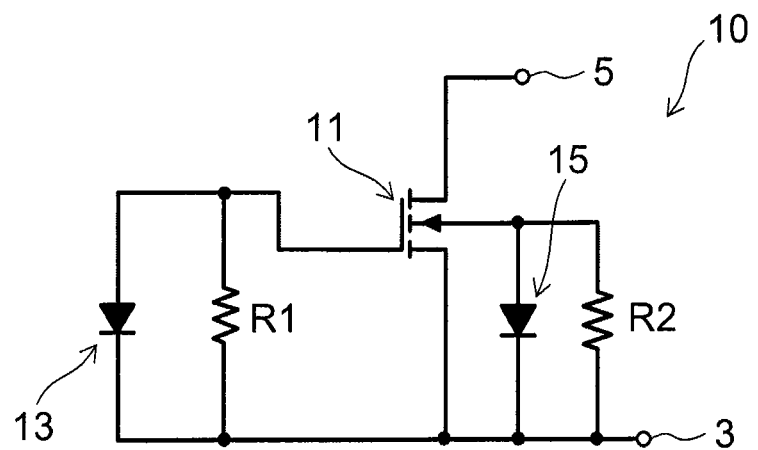
FIGS. 1A and 1B are circuit diagrams illustrating light-receiving circuits according to a first embodiment.

According to an embodiment, a light-receiving circuit includes a MOSFET, a first light-receiving element and a second light-receiving element. The first light-receiving element controls a state of the MOSFET between ON state and OFF state by applying a voltage induced by a light signal between a gate of the MOSFET and a source of the MOSFET; and a second light-receiving element controls a threshold voltage of the MOSFET.

Embodiments will be described with reference to the drawings. In the drawings, the same portions will be denoted by the same reference numerals, detailed description thereof will not be omitted appropriately, and different portions will be described.

First Embodiment

Figure 1B:
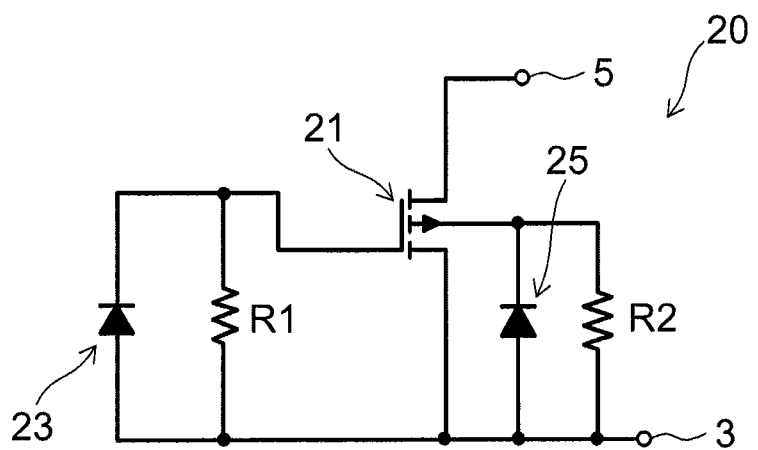

FIGS. 1A and 1B are circuit diagrams, respectively, showing light-receiving circuits 10 and 20 according to the first embodiment.

The light-receiving circuit 10 shown in FIG. 1A includes a MOSFET 11, a first light-receiving element 13, and a second light receiving element 15.

The first light-receiving element 13 receives a light signal and applies a voltage induced by the light signal between the gate and the source of the MOSFET 11. Thereby, a state of the MOSFET 11 is controlled between ON state and OFF state. Hereinafter, it is referred to turning ON/OFF control.

The second light-receiving element 15 receives a light signal and changes a back-gate voltage of the MOSFET 11 to control a threshold voltage of the MOSFET 11. In the embodiment, a voltage induced by a light signal is applied between the back-gate and the source of the MOSFET 11.

Further, the second light-receiving element 15 includes a first discharge path provided between the gate and the source of the MOSFET 11 and a second discharge path provided between the back-gate and the source of the MOSFET 11.

Specifically, the MOSFET 11 is an n-channel MOSFET, of which the source is connected to a ground terminal 3 and the drain is connected to an output terminal 5.

The cathode of the first light-receiving element 13 is connected to the ground terminal 3, and the anode of the first light-receiving element 13 is connected to the gate of the MOSFET 11. On the other hand, the cathode of the second light-receiving element 15 is connected to the ground terminal 3, and the anode of the second light-receiving element 15 is connected to the back-gate of the MOSFET 11.

A resistor R1 that serves as the first discharge path is provided between the gate and the source of the MOSFET 11. Moreover, a resistor R2 that serves as the second discharge path is provided between the back-gate and the source of the MOSFET 11.

Here, both the first and second light-receiving elements 13 and 15 are photodiodes (PDs) that operate in a photovoltaic mode, and receive a light signal simultaneously and operate synchronously. The same is applied to the following embodiments.

The light-receiving circuit 20 shown in FIG. 1B includes a MOSFET 21, a first light-receiving element 23, and a second light-receiving element 25. The MOSFET 21 is a p-channel MOSFET, of which the source is connected to the ground terminal 3 and the drain is connected to the output terminal 5.

The anode of the first light-receiving element 23 is connected to the ground terminal 3, and the cathode of the first light-receiving element 23 is connected to the gate of the MOSFET 21. On the other hand, the anode of the second light-receiving element 25 is connected to the ground terminal 3, and the cathode of the second light-receiving element 25 is connected to the back-gate of the MOSFET 21. Both the first and second light-receiving elements 23 and 25 are PDs that operate in a photovoltaic mode, and receive a light signal simultaneously and operate synchronously.

A resistor R1 that serves as a first discharge path is provided between the gate and the source of the MOSFET 21. Moreover, a resistor R2 that serves as a second discharge path is provided between the back-gate and the source of the MOSFET 21.

Figure 2:
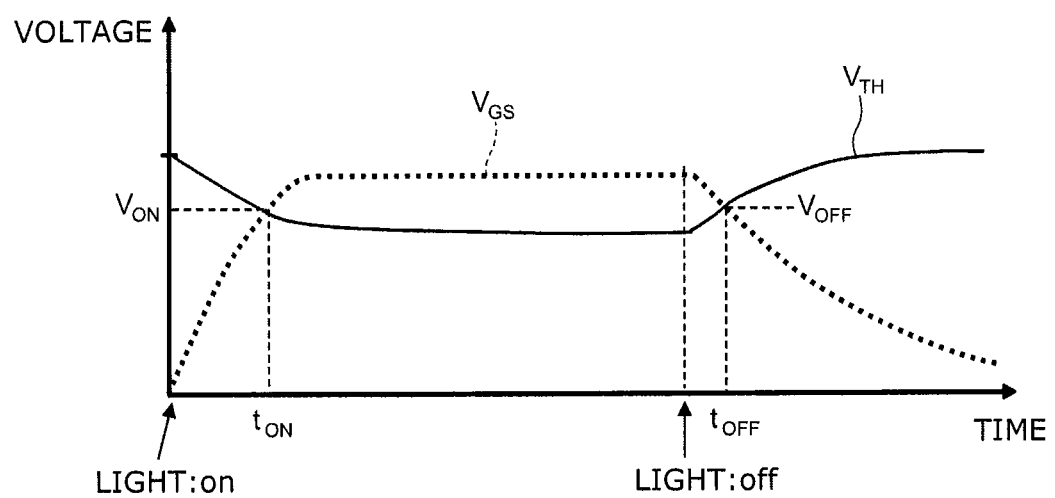
FIG. 2 is a schematic view illustrating the operation of the light-receiving circuit according to the first embodiment.

FIG. 2 is a schematic view showing the operation of the light-receiving circuit 10. For example, FIG. 2 shows changes with time in a threshold voltage $V_{TH}$ and a gate-source voltage of the MOSFET 11.

When the first light-receiving element 13 operating in the photovoltaic mode receives a light signal (LIGHT: ON), the anode voltage of the first light-receiving element 13 increases, and the gate-source voltage $V_{GS}$ of the MOSFET 11 increases. On the other hand, at the same time, the second light-receiving element 15 receives the light signal, and the back-gate voltage of the MOSFET 11 increases. In this way, the threshold voltage $V_{TH}$ of the MOSFET 11 decreases. The state of the MOSFET 11 is changed from the OFF state to the ON state at a point in time $t_{ON}$ at which $V_{TH}$ and $V_{GS}$ cross each other.

Subsequently, when the light signal disappears (LIGHT: OFF), the output current of the first light-receiving element 13 reaches 0 (zero) A, charges are discharged from the gate of the MOSFET 11 through the resistor R1, and the gate-source voltage $V_{GS}$ decreases. At the same time, the output current of the second light-receiving element 15 reaches 0 A, and charges are discharged from the back-gate of the MOSFET 11 through the second discharge path. As a result, the threshold voltage $V_{TH}$ of the MOSFET 11 increases. Thereby, the state of the MOSFET 11 is changed from the ON state to the OFF state at a point in time $t_{OFF}$ at which $V_{TH}$ and $V_{GS}$ cross each other.

The back-gate voltage of the MOSFET 11 increases due to the voltage induced by the light signal in the second light-receiving element 15, and the threshold voltage $V_{TH}$ decreases. In this way, it is possible to control the turning ON/OFF of the MOSFET 11 using voltages $V_{ON}$ and $V_{OFF}$, which are lower than the original threshold voltage in the case where the back-gate voltage is 0 V.

The light-receiving circuit 20 is different from the light-receiving circuit 10 in that the gate-source voltage $V_{GS}$ and the threshold voltage $V_{TH}$ of the MOSFET 21 are negative voltages. Applying the photovoltaic voltage of the second light-receiving element 25 to the back-gate of the MOSFET 21 changes the threshold voltage of the MOSFET 21, and then makes it easier to control the turning ON/OFF of the MOSFET 21.

For example, Japanese Unexamined Patent Application Publication No. 2005-167361 discloses a semiconductor relay that includes a light-receiving element operating in the photovoltaic mode. In the example, a MOSFET is operated using multiple stages of PDs connected in series. In contrast, it is possible to control the turning ON/OFF of the MOSFET using a single stage of PD in the embodiment.

In this way, it is possible to reduce a chip size by decreasing the proportion of the area occupied by the first and second light-receiving elements. Moreover, it is necessary to use the wafer with the complex structure such as silicon-on-insulator (SOI) in order to form a circuit in which multiple PDs are connected in series. In contrast, the light-receiving circuit according to the embodiment may be realized using a simple wafer due to the simple circuit including the single PD.

Figure 3A:
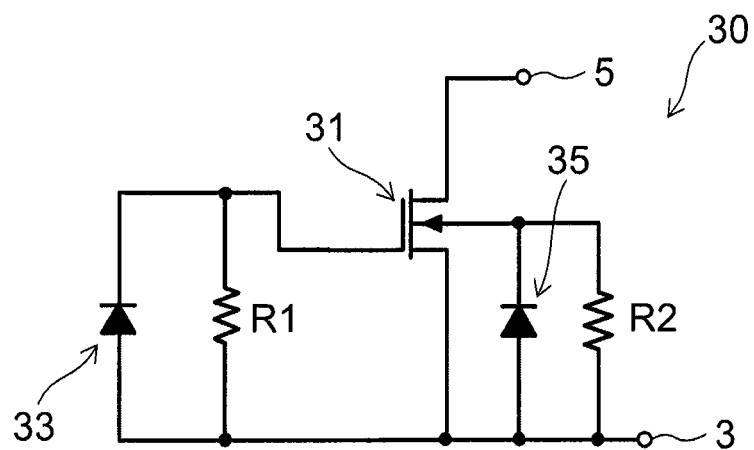
FIGS. 3A and 3B are circuit diagrams illustrating light-receiving circuits according to a variation of the first embodiment.
Figure 3B:
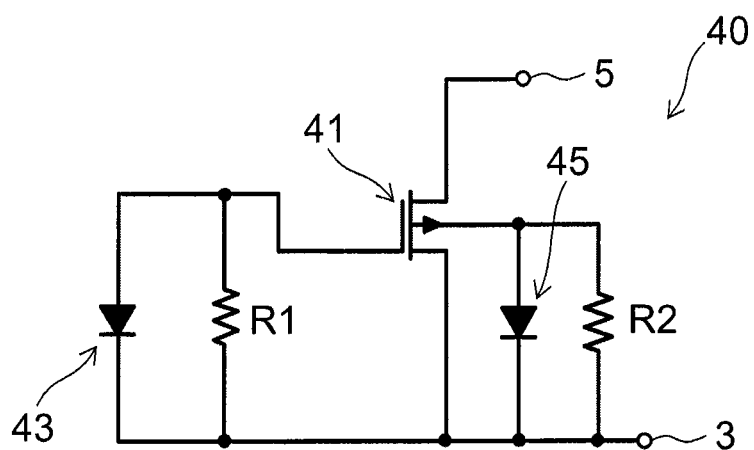

FIGS. 3A and 3B are circuit diagrams, respectively, showing light-receiving circuits 30 and 40 according to a modified example of the first embodiment. The light-receiving circuits 30 and 40 include a depletion-type MOSFET.

The light-receiving circuit 30 shown in FIG. 3A includes a MOSFET 31, a first light-receiving element 33, and a second light-receiving element 35. The MOSFET 31 is an n-channel MOSFET, of which the source is connected to a ground terminal 3 and the drain is connected to an output terminal 5.

The anode of the first light-receiving element 33 is connected to the ground terminal 3, and the cathode of the first light-receiving element 33 is connected to the gate of the MOSFET 31. On the other hand, the anode of the second light-receiving element 35 is connected to the ground terminal 3, and the cathode of the second light-receiving element 35 is connected to the back-gate of the MOSFET 31.

A resistor R1 that serves as a first discharge path is provided between the gate and the source of the MOSFET 31. Moreover, a resistor R2 that serves as a second discharge path is provided between the back-gate and the source of the MOSFET 31.

Here, due to the different operating polarity of the MOSFET 31, the connections of the first and second light-receiving elements 33 and 35 are different from those of the light-receiving circuit 10. However, the operation under controlling the threshold voltage using the back-gate voltage and the effects thereof are the same as those of the light-receiving circuit 10.

The light-receiving circuit 40 shown in FIG. 3B includes a MOSFET 41, a first light-receiving element 43, and a second light-receiving element 45. The MOSFET 41 is a p-channel MOSFET, of which the source is connected to a ground terminal 3 and the drain is connected to an output terminal 5.

The cathode of the first light-receiving element 43 is connected to the ground terminal 3, and the anode of the first light-receiving element 43 is connected to the gate of the MOSFET 41. On the other hand, the cathode of the second light-receiving element 45 is connected to the ground terminal 3, and the anode of the second light-receiving element 45 is connected to the back-gate of the MOSFET 41.

A resistor R1 that serves as a first discharge path is provided between the gate and the source of the MOSFET 41. Moreover, a resistor R2 that serves as a second discharge path is provided between the back-gate and the source of the MOSFET 41.

Here, the MOSFET 41 is a p-channel MOSFET, and the polarities of the first and second light-receiving elements 43 and 45 are changed so as to correspond to the p-channel MOSFET. However, the operation under controlling the threshold voltage using the back-gate voltage and the effect thereof are the same as those of the light-receiving circuit 30.

Second Embodiment

Figure 4A:
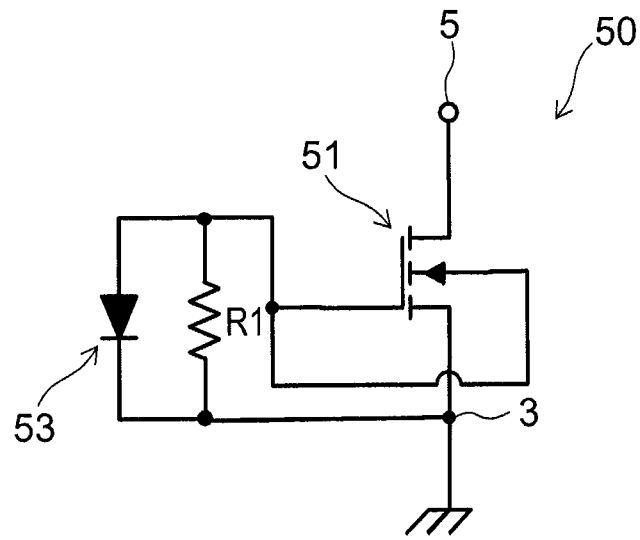
FIGS. 4A and 4B are circuit diagrams illustrating light-receiving circuits according to a second embodiment.
Figure 4B:
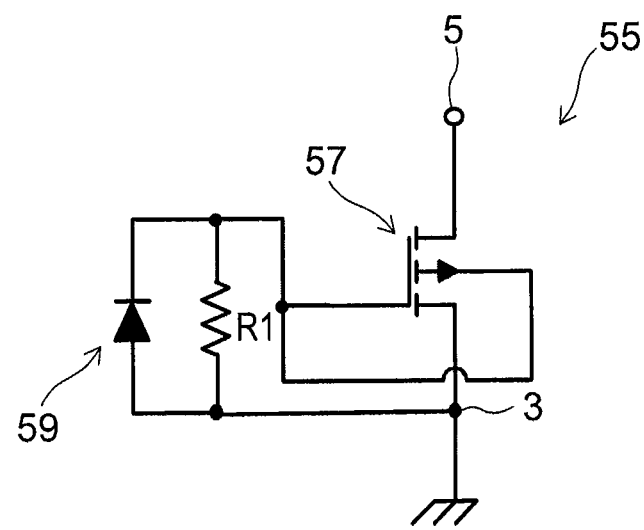

FIGS. 4A and 4B are circuit diagrams, respectively, showing light-receiving circuits 50 and 55 according to the second embodiment.

A light-receiving circuit 50 shown in FIG. 4A includes a MOSFET 51 and a first light-receiving element 53. The MOSFET 51 is an n-channel MOSFET, of which the source is connected to a ground terminal 3 and the drain is connected to an output terminal 5.

The cathode of the first light-receiving element 53 is connected to the ground terminal 3. On the other hand, the anode of the first light-receiving element 53 is connected to the gate and the back-gate of the MOSFET 51. Moreover, a resistor R1 that serves as a first discharge path is provided between the gate and the source of the MOSFET 51.

The light-receiving circuit 55 shown in FIG. 4B includes a MOSFET 57 and a first light-receiving element 59. The MOSFET 57 is a p-channel MOSFET, of which the source is connected to a ground terminal 3 and the drain is connected to an output terminal 5.

The anode of the first light-receiving element 59 is connected to the ground terminal 3. On the other hand, the cathode of the first light-receiving element 59 is connected to the gate and the back-gate of the MOSFET 57. Moreover, a resistor R1 that serves as a first discharge path is provided between the gate and the source of the MOSFET 57.

In the embodiment, the first light-receiving element and the second light-receiving element are the same light-receiving element. The operation under controlling the threshold voltage using the back-gate voltage and the effect thereof are the same as those of the light-receiving circuits 10 and 20.

Figure 5:
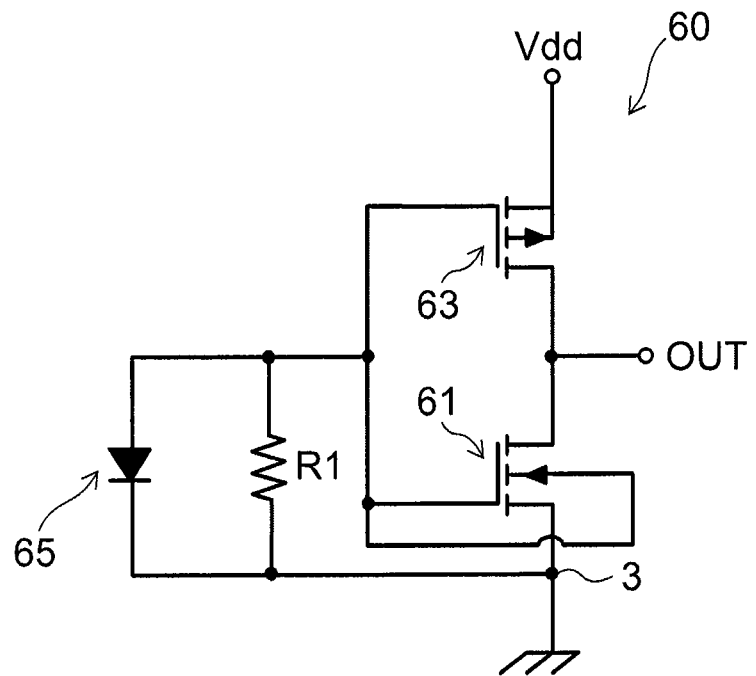
FIG. 5 is a circuit diagram illustrating a light-receiving circuit according to a variation of the second embodiment.

FIG. 5 is a circuit diagram showing a light-receiving circuit 60 according to a variation of the second embodiment. As shown in FIG. 5, the light-receiving circuit 60 includes an output stage that includes a first MOSFET 61 and a second MOSFET 63 and a first light-receiving element 65.

At the output stage, the second MOSFET 63 is connected in series to the first MOSFET 61. Moreover, high and low voltages are alternately output at the connection point between the first and second MOSFETs 61 and 63.

The first light-receiving element 65 applies a voltage induced by a light signal between the respective gates of the first and second MOSFETs 61 and 63 and the source of the first MOSFET 61. Thereby, the output at the output stage is inverted from one of the high (H) and low (L) level to the other.

In the embodiment, the first light-receiving element 65 applies a voltage induced by a light signal between the back-gate and the source of the first MOSFET 61 and controls the threshold voltage of the first MOSFET 61.

The first MOSFET 61 is an n-channel MOSFET, and the second MOSFET 63 is a p-channel MOSFET. Moreover, the output stage of the light-receiving circuit 60 has a CMOS structure, which includes a p-channel MOSFET and an n-channel MOSFET. The cathode of the first light-receiving element 65 is connected to a ground terminal 3, and the anode of the first light-receiving element 65 is connected to the gate and the back-gate of the first MOSFET 61 and the gate of the second MOSFET 63.

Here, the photovoltaic voltage of the first light-receiving element 65 is applied to the back-gate of the first MOSFET 61, and changes the threshold voltage $V_{TH}$. The effect thereof is the same as that of the light-receiving circuit 10.

Figure 6:
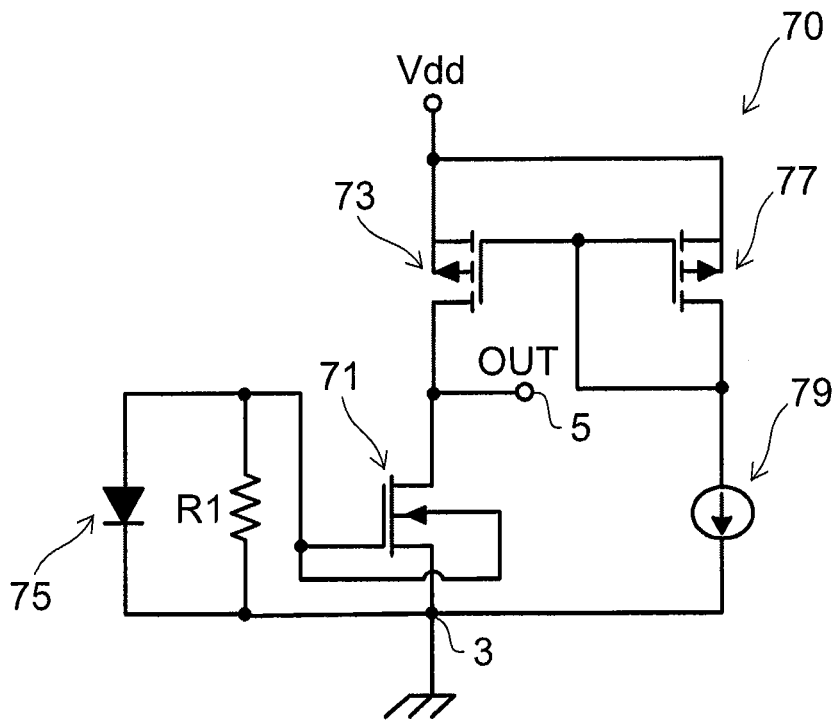
FIG. 6 is a circuit diagram illustrating a light-receiving circuit according to another variation of the second embodiment.

FIG. 6 is a circuit diagram showing a light-receiving circuit 70 according to another variation of the second embodiment. The light-receiving circuit 70 includes an output stage, which has a CMOS configuration that includes a first MOSFET 71 and a second MOSFET 73, and a first light-receiving element 75.

The first MOSFET 71 is an n-channel MOSFET, and the second MOSFET 73 is a p-channel MOSFET. Moreover, the first MOSFET 71 is a depletion-type MOSFET, and the second MOSFET 73 is an enhancement-type MOSFET. The second MOSFET 73 is disposed on a side close to a power supply terminal Vdd and is connected in series to the first MOSFET 71.

The cathode of the first light-receiving element 75 is connected to a ground terminal 3, and the anode of the first light-receiving element 75 is connected to the gate and the back-gate of the first MOSFET 71. Further, a p-channel MOSFET 77 and a current source 79 connected to the gate and the drain of the p-channel MOSFET 77 are provided at the output stage. Moreover, the gate of the second MOSFET 73 and the gate of the MOSFET 77 are connected to form a current mirror circuit.

That is, the output at the connection point between the first and second MOSFETs 71 and 73 is switched according to a magnitude relation between the current of the current source 79 and the current flowing through the first MOSFET 71. Moreover, applying the photovoltaic voltage of the first light-receiving element 75 between the back-gate and the source of the first MOSFET 71 changes the threshold voltage, and makes it easy to control the current flowing through the first MOSFET 71.

Although not shown in the drawing, a light-receiving circuit having the same function can be formed even when an enhancement-type n-channel MOSFET is used as the first MOSFET 71.

Third Embodiment

Figure 7A:
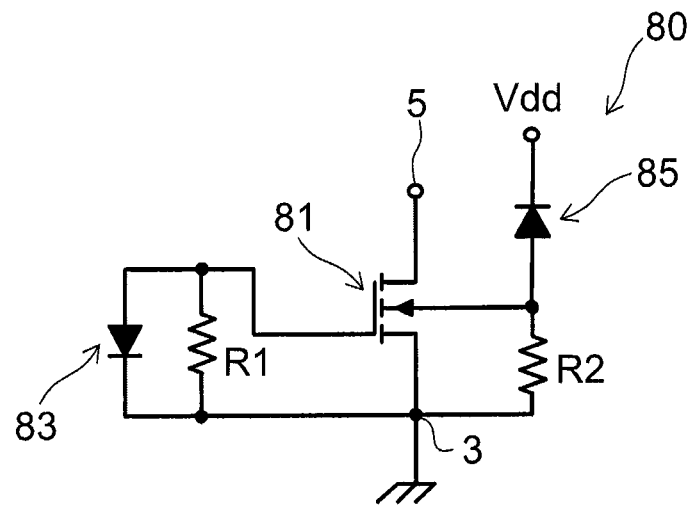
FIGS. 7A and 7B are circuit diagrams illustrating light-receiving circuits according to a third embodiment.
Figure 7B:
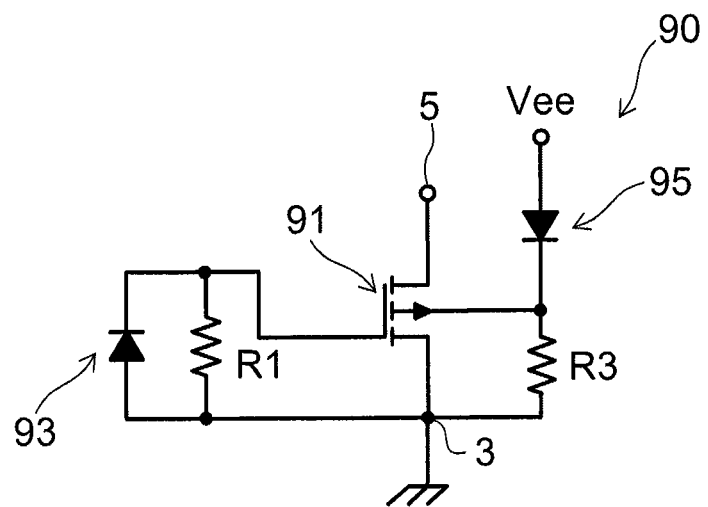

FIGS. 7A and 7B are circuit diagrams, respectively, showing light-receiving circuits 80 and 90 according to the third embodiment.

The light-receiving circuit 80 shown in FIG. 7A includes a MOSFET 81, a first light-receiving element 83, and a second light-receiving element 85. The MOSFET 81 is an n-channel MOSFET, of which the source is connected to a ground terminal 3 and the drain is connected to an output terminal 5.

The cathode of the first light-receiving element 83 is connected to the ground terminal 3, and the anode of the first light-receiving element 83 is connected to the gate of the MOSFET 81. On the other hand, the cathode of the second light-receiving element 85 is connected to a power supply terminal Vdd, and the anode of the second light-receiving element 85 is connected to the back-gate of the MOSFET 81.

A resistor R1 that serves as a first discharge path is provided between the gate and the source of the MOSFET 81. Moreover, a resistor R2 that serves as a second discharge path is provided between the back-gate and the source of the MOSFET 81.

The second light-receiving element 85 is connected to the power supply terminal Vdd and operates in a PD mode where it receives a light signal to output a photocurrent. Moreover, the voltage at the connection point between the second light-receiving element 85 and the resistor R2, namely the back-gate voltage, is increased, and the threshold voltage $V_{TH}$ of the MOSFET 81 is decreased, while the second light-receiving element 85 receives the light signal. In this way, it is possible to easily control the turning ON/OFF of the MOSFET 81.

The light-receiving circuit 90 shown in FIG. 7B includes a MOSFET 91, a first light-receiving element 93, and a second light-receiving element 95. The MOSFET 91 is a p-channel MOSFET, of which the source is connected to a ground terminal 3 and the drain is connected to an output terminal 5.

The anode of the first light-receiving element 93 is connected to the ground terminal 3, and the cathode of the first light-receiving element 93 is connected to the gate of the MOSFET 91. On the other hand, the cathode of the second light-receiving element 95 is connected to the back-gate of the MOSFET 91, and the anode of the second light-receiving element 95 is connected to a negative power supply terminal Vee. Further, the cathode of the second light-receiving element 95 is connected to the ground terminal 3 through a resistor R3. A resistor R1 that serves as a first discharge path is provided between the gate and the source of the MOSFET 91.

Here, the second light-receiving element 95 is connected to the negative power supply terminal Vee and operates in the PD mode where it receives a light signal to output a photocurrent. Moreover, the voltage at the connection point between the second light-receiving element 95 and the resistor R3, namely the back-gate voltage, is increased, and the threshold voltage $V_{TH}$ of the MOSFET 91 is increased, while the second light-receiving element 95 receives the light signal. In this way, it is possible to easily control the turning ON/OFF of the MOSFET 91.

Fourth Embodiment

Figure 8A:
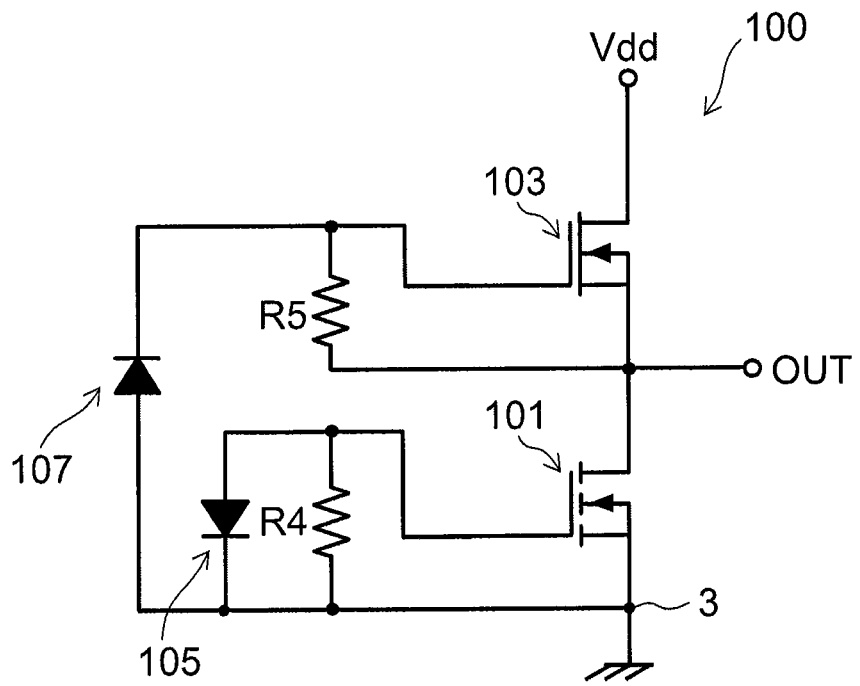
FIGS. 8A and 8B are circuit diagrams illustrating light-receiving circuits according to a fourth embodiment.

FIG. 8A is a circuit diagram showing a light-receiving circuit 100 according to the fourth embodiment. As shown in FIG. 8A, the light-receiving circuit 100 includes an output stage, which includes a first MOSFET 101 and a second MOSFET 103, a first light-receiving element 105, and a second light-receiving element 107.

The second MOSFET 103 is connected in series to the first MOSFET 101. In the output stage, high and low voltages are alternately output at the connection point between the first and second MOSFETs 101 and 103.

The first light-receiving element 105 receives a light signal and applies a voltage induced by the light signal between the gate and the source of the first MOSFET 101. The second light-receiving element 107 receives the light signal simultaneously with the first light-receiving element 105 and applies a voltage induced by the light signal between the gate and the source of the second MOSFET 103. Moreover, the output at the output stage is inverted from one of the high (H) and low (L) level to the other.

Further, the second light-receiving element 107 includes a first discharge path provided between the gate and the source of the first MOSFET 101 and a second discharge path provided between the gate and the source of the second MOSFET 103.

Specifically, the first MOSFET 101 is an enhancement-type n-channel MOSFET and is disposed on a side close to the ground terminal 3. The second MOSFET 103 is a depletion-type n-channel MOSFET and is disposed on a side closed to a power supply terminal Vdd. Moreover, the source of the first MOSFET 101 is connected to the ground terminal, and the drain of the first MOSFET 101 is connected to the source of the second MOSFET 103. The drain of the second MOSFET 103 is connected to the power supply terminal Vdd.

The cathode of the first light-receiving element 105 is connected to the ground terminal 3, and the anode of the first light-receiving element 105 is connected to the gate of the first MOSFET 101. On the other hand, the anode of the second light-receiving element 107 is connected to the ground terminal 3, and the cathode of the second light-receiving element 107 is connected to the gate of the second MOSFET 103.

Further, a resistor R4 that serves as the first discharge path is provided between the gate and the source of the first MOSFET 101. Moreover, a resistor R5 that serves as the second discharge path is connected between the gate and the source of the second MOSFET 103.

Here, it is assumed that the first and second light-receiving elements 105 and 107 operate in the photovoltaic mode and generate a photovoltaic voltage of $V_{BE}$, respectively. Moreover, it is assumed that the threshold voltage $V_{TH}$ of each of the first and second MOSFETs 101 and 103 satisfies the following equation (1).

$$|V_{TH}| < V_{BE} \quad (1)$$

Thereby, it becomes possible to control the turning ON/OFF of the first MOSFET 101 by the first light-receiving element 105. Moreover, the second light-receiving element 107 may control the turning ON/OFF of the second MOSFET 103.

Next, the operation of the light-receiving circuit 100 will be described. First, the first enhancement-type MOSFET 101 is in the OFF state, while there is no light illumination, no photovoltaic power is generated in the first light-receiving element 105, and the gate-source voltage $V_{GS1}$ of the first MOSFET 101 is 0 (zero) V. Similarly, the second depletion-type MOSFET 103 is in the ON state, while no photovoltaic power is generated in the second light-receiving element 107, the gate-source voltage $V_{GS2}$ of the second MOSFET 103 is 0 (zero) V.

Thereby, the output voltage $V_{OUT}$ between the first and second MOSFETs 101 and 103 becomes the H level (=Vdd). Strictly speaking, the output voltage $V_{OUT}$ becomes a voltage corresponding to a subtraction of the drain-source voltage $V_{DS2}$ of the second MOSFET 103 from the power supply voltage Vdd. However, in the following description, $V_{DS2}$ is sufficiently small and is thus ignored.

On the other hand, when there is light illumination, photovoltaic power is generated in the first light-receiving element 105, and a photovoltaic voltage $V_{BE}$ is generated across both ends of the first light-receiving element 105. Thus, the gate voltage of the first MOSFET 101 increases, the gate-source voltage $V_{GS1}$ of the first MOSFET 101 becomes positive, and the first MOSFET 101 enters into the ON state. Similarly, when photovoltaic power is generated in the second light-receiving element 107, the gate voltage of the second MOSFET 103 decreases. Thereby, the gate-source voltage $V_{GS2}$ becomes negative, and the second MOSFET 103 enters into the OFF state. Moreover, the output voltage $V_{OUT}$ becomes the L level (=0 V).

Moreover, when light illumination disappears, charges collected between the gate and the source of the second MOSFET 103 are discharged through the discharge resistor R5. Charges collected between the gate and the source of the first MOSFET 101 are also discharged through the discharge resistor R4.

Table 1 indicates the output voltages $V_{OUT}$ of the first and second MOSFETs 101 and 103.

TABLE 1

| | MOSFET101 | | MOSFET103 | | $V_{OUT}$ |
|---|---|---|---|---|---|
| Light | $V_{GS}$ | State | $V_{GS}$ | State | State |
| ON | Positive | ON | Negative | OFF | L |
| OFF | 0 | OFF | 0 | ON | H |

As above, the first and second light-receiving elements 105 and 107 receive a light signal, operate in the photovoltaic mode, and respectively, control the turning ON/OFF of the first and second MOSFETs 101 and 103 in the embodiment. Moreover, since the first and second MOSFETs 101 and 103 are not simultaneously turned ON except during inversion of the output voltage $V_{OUT}$, there is no current flowing in the steady state. Thus, it is possible to suppress average power consumption in the light-receiving circuit 100.

Figure 8B:
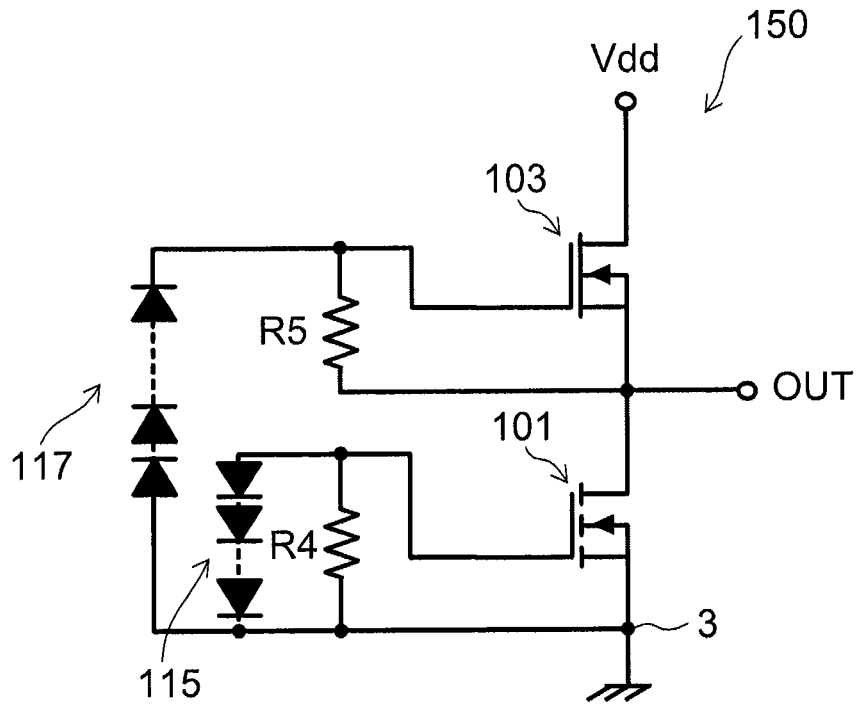

FIG. 8B is a circuit diagram illustrating a light-receiving circuit 150 according to a variation of the fourth embodiment. In the light-receiving circuit 150, a first light-receiving element 115 and a second light-receiving element 117 are disposed, respectively, instead of the first and second light-receiving elements 105 and 107 of the light-receiving circuit 100. The first and second light-receiving elements 115 and 117 include multiple photodiodes (PDs) that are connected in series. Therefore, a higher photovoltaic voltage $V_{BE}$ than that of the light-receiving circuit 100 can be applied to the first and second MOSFETs 101 and 103.

Fifth Embodiment

Figure 9:
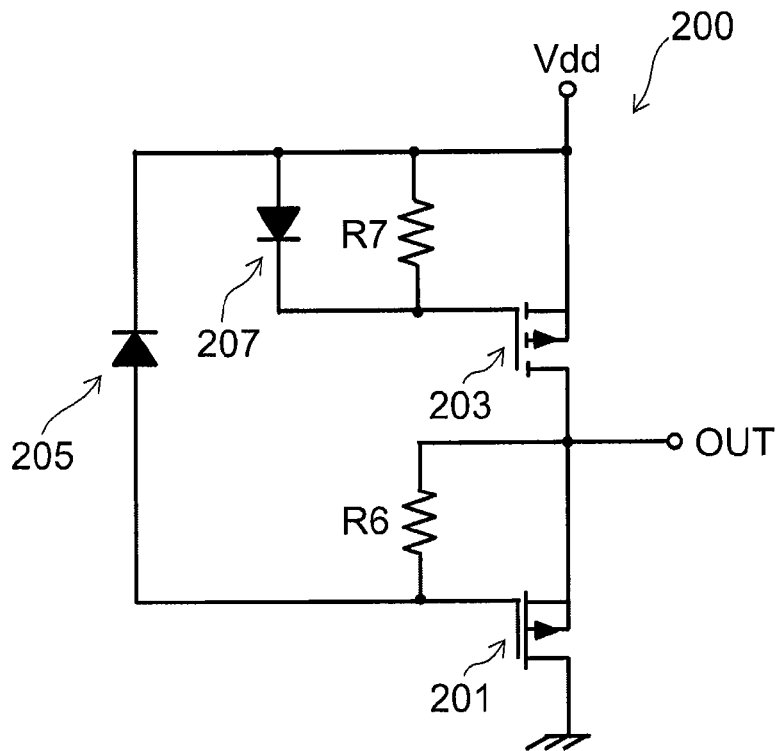
FIG. 9 is a circuit diagram illustrating a light-receiving circuit according to a fifth embodiment.

FIG. 9 is a circuit diagram illustrating a light-receiving circuit 200 according to the fifth embodiment. The light-receiving circuit 200 includes an output stage, which includes a first MOSFET 201 and a second MOSFET 203, a first light-receiving element 205, and a second light-receiving element 207.

The first MOSFET 201 is a depletion-type p-channel MOSFET, of which the drain is connected to the ground and the source is connected to the drain of the second MOSFET 203. The second MOSFET 203 is an enhancement-type p-channel MOSFET, of which the drain is connected to a power supply terminal Vdd.

The cathode of the first light-receiving element 205 is connected to the power supply terminal Vdd and the anode of the first light-receiving element 205 is connected to the gate of the first MOSFET 201. On the other hand, the anode of the second light-receiving element 207 is connected to the power supply terminal Vdd and the cathode of the second light-receiving element 207 is connected to the gate of the second MOSFET 203.

Further, a resistor R6 that serves as a first discharge path is provided between the gate and the source of the first MOSFET 201. Moreover, a resistor R7 that serves as a second discharge path is connected between the gate and the source of the second MOSFET 203.

In the embodiment, the first light-receiving element 205 operates in the photovoltaic mode, receives a light signal, and controls the gate voltage of the first MOSFET 201. The second light-receiving element 207 also operates in the photovoltaic mode and applies a voltage induced by the light signal between the gate and the source of the second MOSFET 203.

Table 2 indicates the operation state of the light-receiving circuit 200 depending on the presence of light illumination.

TABLE 2

| Light | MOSFET201 $V_{GS}$ | MOSFET201 State | MOSFET203 $V_{GS}$ | MOSFET203 State | $V_{OUT}$ State |
|---|---|---|---|---|---|
| ON | Positive | OFF | Negative | ON | H |
| OFF | 0 | ON | 0 | OFF | H |

While there is light illumination, a photocurrent flows in the first light-receiving element 205 and charges the gate-source capacitor of the first MOSFET 201 until the gate voltage of the first MOSFET 201 reaches Vdd+$V_{BE}$. Thus, the gate-source voltage $V_{GS1}$ becomes positive, and the first MOSFET 201 enters into the OFF state. A photovoltaic voltage $V_{BE}$ is generated in the second light-receiving element 207, and the gate voltage of the second MOSFET 203 decreases. Thereby, the gate-source voltage $V_{GS2}$ becomes negative, and the second MOSFET 203 enters into the ON state. Moreover, the output voltage $V_{OUT}$ becomes the H level (=Vdd). In this case, the voltage $V_{BE}$ and the threshold voltage $|V_{TH}|$ of each of the first and second MOSFETs 201 and 203 satisfy the equation (1).

On the other hand, when light illumination disappears, no photocurrent flows in the first light-receiving element 205, the gate voltage of the first MOSFET 201 decreases, and the gate-source voltage $V_{GS1}$ becomes 0 (zero) V. Thus, the state of the first MOSFET 201 is inverted to the ON state. No photovoltaic power is generated in the second light-receiving element 207, and the gate voltage of the second MOSFET 203 increases. The gate-source voltage $V_{GS2}$ becomes 0 V, and the second MOSFET 203 enters into the OFF state. Thereby, the output voltage $V_{OUT}$ between the first and second MOSFETs 201 and 203 becomes the L level (=0 V).

Charges collected between the gate and the source of the first MOSFET 201 are discharged through the discharge resistor R6. On the other hand, charges collected between the gate and the source of the second MOSFET 203 are discharged through the discharge resistor R7.

In the embodiment, the first and second MOSFETs 201 and 203 are not simultaneously turned ON except during the inversion of the output voltage $V_{OUT}$. Thus, there is no current flowing in the steady state, and the average power consumption of the light-receiving circuit 200 is suppressed.

Sixth Embodiment

Figure 10:
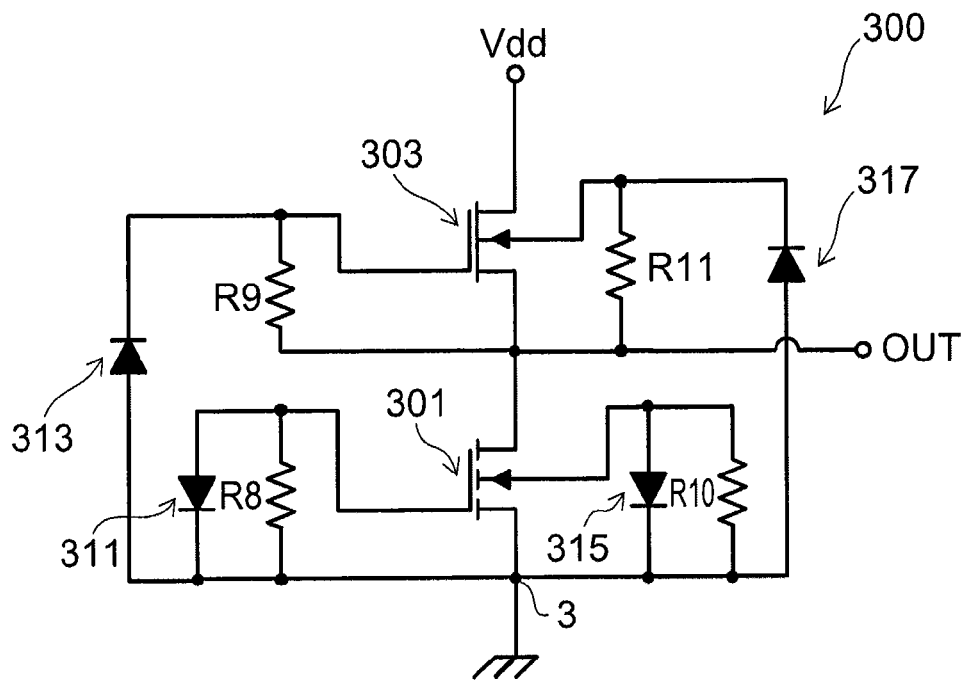
FIG. 10 is a circuit diagram illustrating a light-receiving circuit according to a sixth embodiment.

FIG. 10 is a circuit diagram illustrating a light-receiving circuit 300 according to the sixth embodiment. The light-receiving circuit 300 includes an output stage, which includes a first MOSFET 301 and a second MOSFET 303, a first light-receiving element 311, and a second light-receiving element 313. Further, the light-receiving circuit 300 includes a third light-receiving element 315 provided on a side close to the back-gate of the first MOSFET 301 and a fourth light-receiving element 317 provided on a side close to the back-gate of the second MOSFET 303.

The first MOSFET 301 is an enhancement-type n-channel MOSFET and is disposed on a side close to a ground terminal 3. The second MOSFET 303 is a depletion-type n-channel MOSFET and is disposed on a side close to a power supply terminal Vdd. The source of the first MOSFET 301 is connected to the ground terminal 3 and the drain of the first MOSFET 301 is connected to the source of the second MOSFET 303. The drain of the second MOSFET 303 is connected to the power supply terminal Vdd.

The cathode of the first light-receiving element 311 is connected to the ground terminal 3 and the anode of the first light-receiving element 311 is connected to the gate of the first MOSFET 301. On the other hand, the anode of the second light-receiving element 313 is connected to the ground terminal 3 and the cathode of the second light-receiving element 313 is connected to the gate of the second MOSFET 303.

Further, a resistor R8 that serves as a first discharge path is provided between the gate and the source of the first MOSFET 301. Moreover, a resistor R9 that serves as a second discharge path is provided between the gate and the source of the second MOSFET 303.

The cathode of the third light-receiving element 315 is connected to the ground terminal 3 and the anode of the third light-receiving element 315 is connected to the back-gate of the first MOSFET 301. The anode of the fourth light-receiving element 317 is connected to the ground terminal 3 and the cathode of the fourth light-receiving element 317 is connected to the back-gate of the second MOSFET 303.

Further, a resistor R10 that serves as a third discharge path is provided between the back-gate and the source of the first MOSFET 301. Moreover, a resistor R11 that serves as a fourth discharge path is provided between the back-gate and the source of the second MOSFET 303.

In the embodiment, the third light-receiving element 315 decreases the threshold voltage of the first MOSFET 301, and the fourth light-receiving element 317 increases the threshold voltage of the second MOSFET 303. Thus, even when the photovoltaic voltage $V_{BE}$ in each of the first and second light-receiving elements 311 and 313 and the threshold voltage $V_{TH}$ in each of the first and second MOSFETs 301 and 303 are in a magnitude relation satisfying the equation (2), it is possible to control the turning ON/OFF of the first MOSFET 301 by the first light-receiving element 311.

$$|V_{BE}| < |V_{TH}| \qquad (2)$$

Moreover, the second light-receiving element 313 may control the turning ON/OFF of the second MOSFET 303.

The operation of the light-receiving circuit 300 is the same as the operation of the light-receiving circuit 100 in Table 1. In the embodiment, the light-receiving circuit 300 operates with small power consumption, while suppressing static current.

While there is no light illumination, the first MOSFET 301 is in the OFF state, and the second MOSFET 303 is in the ON state. When the first to fourth light-receiving elements receive light, the state of the first MOSFET 301 is inverted to the ON state, the state of the second MOSFET 303 is inverted to the OFF state, and the output voltage $V_{OUT}$ is inverted to the L level (=0 V).

While there is light illumination, a photovoltaic voltage $V_{BE}$ is generated in the third light-receiving element 315, and increases the back-gate voltage of the first MOSFET 301. Thus, even when the threshold voltage $V_{TH}$ decreases, and the state expressed by equation (2) is satisfied, the photovoltaic voltage $V_{BE}$ of the first light-receiving element 311 may invert the first MOSFET 301 into the ON state. Moreover, a photovoltaic voltage $-V_{BE}$ is generated in the fourth light-receiving element 317, and the back-gate voltage of the second MOSFET 303 decreases. Thereby, the threshold voltage $V_{TH}$ of the second MOSFET 303 increases, that is, the absolute value $|V_{TH}|$ decreases, and the photovoltaic voltage $-V_{BE}$ of the second light-receiving element 313 inverts the second MOSFET 303 into the OFF state.

It may be possible to omit the third light-receiving element 315 and the resistor R10 by connecting the anode of the first light-receiving element 311 to the back-gate of the first MOSFET 301. Moreover, it may also be possible to omit the fourth light-receiving element 317 and the resistor R11 by connecting the cathode of the second light-receiving element 313 to the back-gate of the second MOSFET 303.

Figure 11:
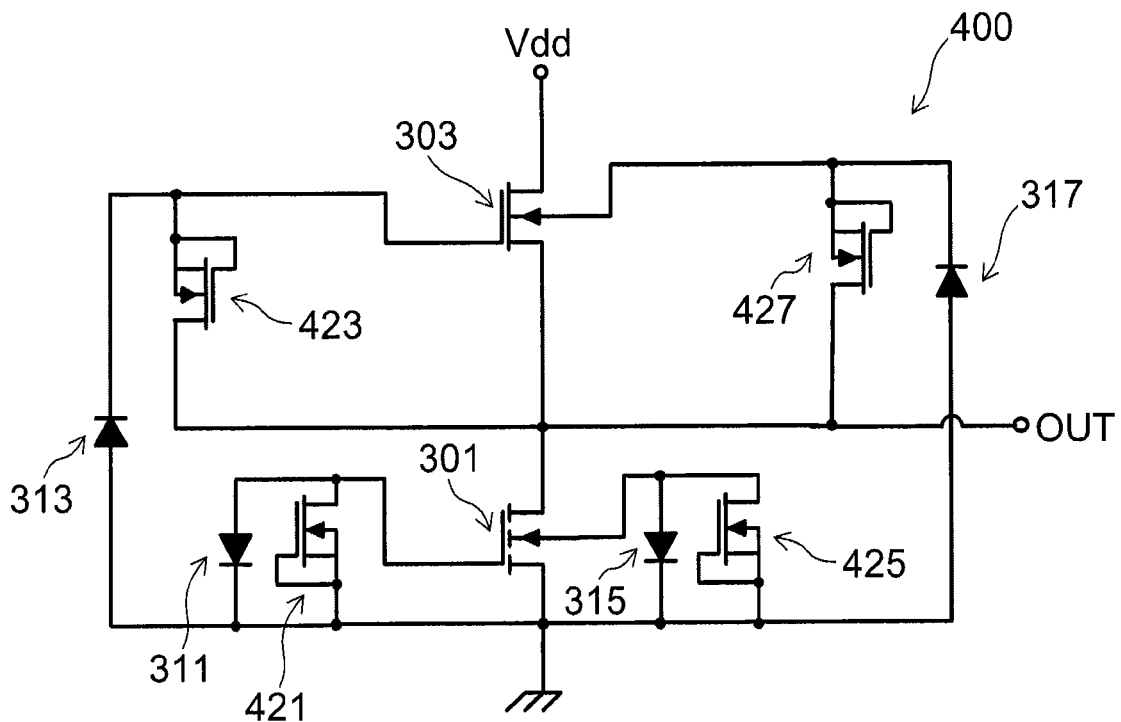
FIG. 11 is a circuit diagram illustrating a light-receiving circuit according to a variation of the sixth embodiment.

FIG. 11 is a circuit diagram illustrating a light-receiving circuit 400 according to a variation of the sixth embodiment. In the light-receiving circuit 400, the resistors R8 to R11 that serve as the first to fourth discharge paths of the light-receiving circuit 300 are replaced with depletion-type n-channel MOSFETs 421, 423, 425, and 427 in which the gate and the source are shorted.

The MOSFETs 421 to 427 are always in the ON state, and charges collected between the gate and the source and between the back-gate and the source in the first MOSFET 301, and charges collected between the gate and the source and between the back-gate and the source in the second MOSFET 303 can be discharged faster than the discharge paths in which a resistor is used. Moreover, it is possible to shorten the falling time of the gate voltage.

Seventh Embodiment

Figure 12:
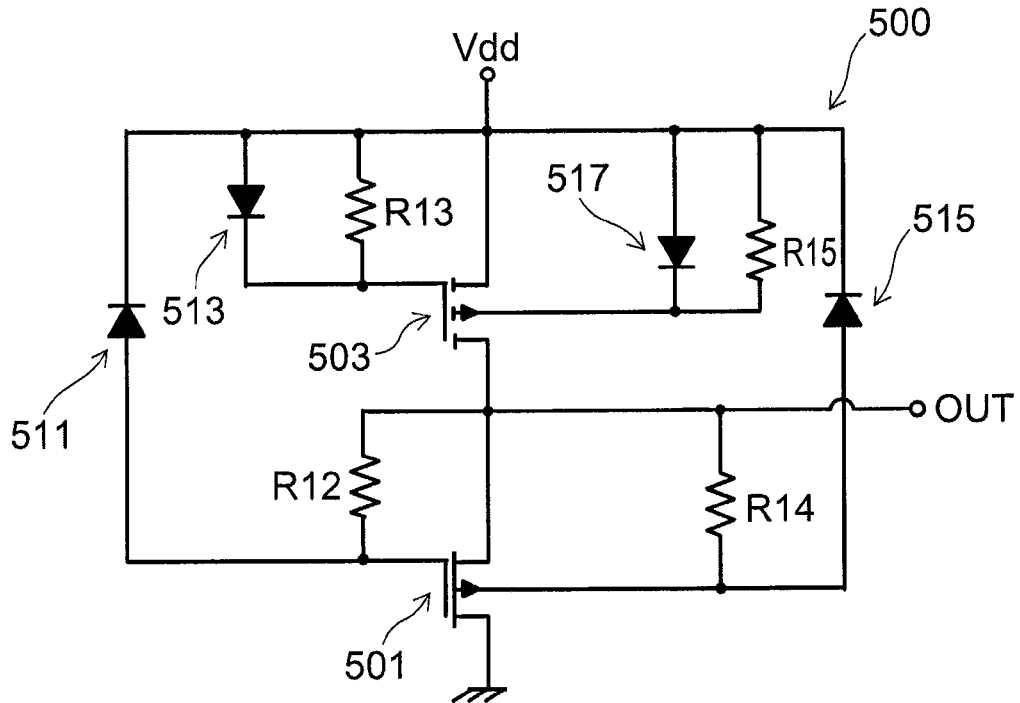
FIG. 12 is a circuit diagram illustrating a light-receiving circuit according to a seventh embodiment.

FIG. 12 is a circuit diagram illustrating a light-receiving circuit 500 according to the seventh embodiment. The light-receiving circuit 500 includes an output stage, which includes a first MOSFET 501 and a second MOSFET 503, a first light-receiving element 511, and a second light-receiving element 513. Further, the light-receiving circuit 500 includes a third light-receiving element 515 that is provided on a side close to the back-gate of the first MOSFET 501 and a fourth light-receiving element 517 that is provided on a side close to the back-gate of the second MOSFET 503.

The first MOSFET 501 is a depletion-type p-channel MOSFET, of which the drain is connected to the ground and the source is connected to the drain of the second MOSFET 503. The second MOSFET 503 is an enhancement-type p-channel MOSFET, of which the source is connected to a power supply terminal Vdd.

The cathode of the first light-receiving element 511 is connected to the power supply terminal Vdd and the anode of the first light-receiving element 511 is connected to the gate of the first MOSFET 501. On the other hand, the anode of the second light-receiving element 513 is connected to the power supply terminal Vdd and the cathode of the second light-receiving element 513 is connected to the gate of the second MOSFET 503.

Further, a resistor R12 that serves as a first discharge path is provided between the gate and the source of the first MOSFET 501. Moreover, a resistor R13 that serves as a second discharge path is provided between the gate and the source of the second MOSFET 503.

The cathode of the third light-receiving element 515 is connected to the power supply terminal Vdd and the anode of the third light-receiving element 515 is connected to the back-gate of the first MOSFET 501. The anode of the second light-receiving element 517 is connected to the power supply terminal Vdd and the cathode of the second light-receiving element 517 is connected to the back-gate of the second MOSFET 503.

Further, a resistor R14 that serves as a third discharge path is provided between the back-gate and the source of the first MOSFET 501. Moreover, a resistor R15 that serves as a fourth discharge path is provided between the back-gate and the source of the second MOSFET 503.

In the embodiment, the first light-receiving element 511 operates in the photovoltaic mode, receives a light signal, and controls the gate voltage of the first MOSFET 501. The second light-receiving element 513 also operates in the photovoltaic mode and applies a voltage $V_{BE}$ induced by the light signal between the gate and the source of the second MOSFET 503.

Further, the third light-receiving element 515 operates in the photovoltaic mode, receives a light signal, and controls the back-gate voltage of the first MOSFET 501. The second light-receiving element 517 also operates in the photovoltaic mode and applies a voltage $V_{BE}$ induced by the light signal between the back-gate and the source of the second MOSFET 503.

The operation of the light-receiving circuit 500 is the same as the operation of the light-receiving circuit 200 in Table 2. In the embodiment, the light-receiving circuit 500 can operate with small power consumption while suppressing static current.

While there is no light illumination, the first MOSFET 501 is in the ON state, and the second MOSFET 503 is in the OFF state. When the first to fourth light-receiving elements receive light, the first MOSFET 501 is inverted into the OFF state, the second MOSFET 503 is inverted into the ON state, and the output voltage $V_{OUT}$ is inverted to the H level (=Vdd).

When there is light illumination, a photocurrent flows in the third light-receiving element 515 and increase the back-gate voltage of the first MOSFET 501 to Vdd+$V_{BE}$. Thus, the threshold voltage $V_{TH}$ increases. Therefore, the first MOS- FET 501 can be easily inverted into the OFF state. Moreover, a photovoltaic voltage $V_{BE}$ is generated in the fourth light-receiving element 517, which decreases the back-gate voltage of the second MOSFET 503. As a result, the threshold voltage of the second MOSFET 503 increases, that is, the absolute value $|V_{TH}|$ decreases, and the photovoltaic voltage $V_{BE}$ of the second light-receiving element may invert the second MOSFET 503 into the ON state.

Eighth Embodiment

Figure 13:
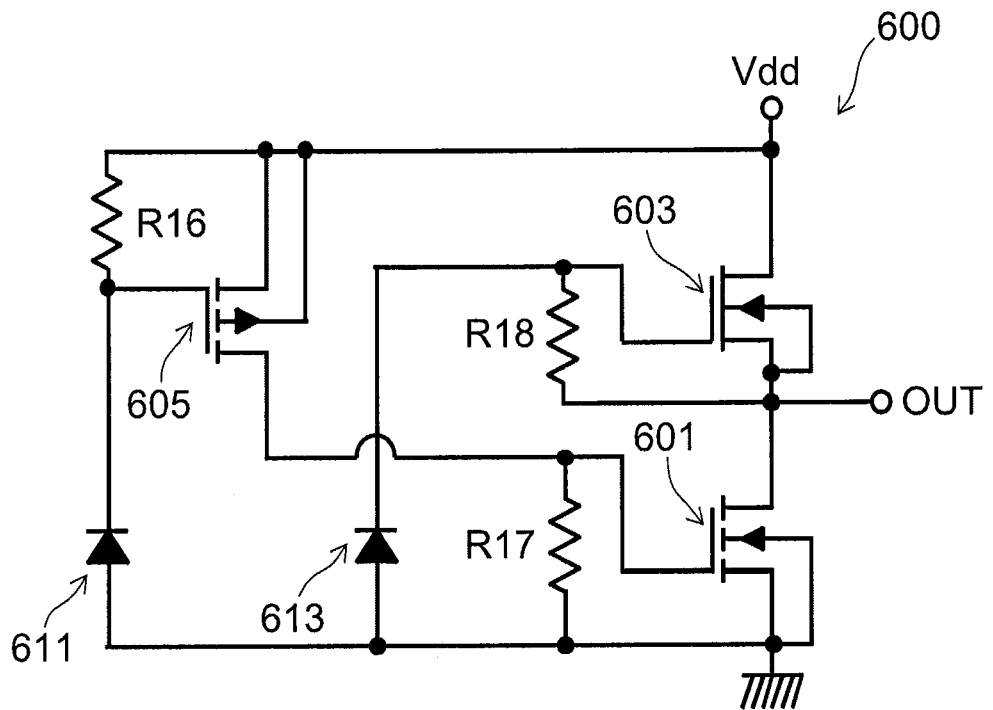
FIG. 13 is a circuit diagram illustrating a light-receiving circuit according to an eighth embodiment.

FIG. 13 is a circuit diagram illustrating a light-receiving circuit 600 according to the eighth embodiment. The light-receiving circuit 600 includes an output stage, which includes a first MOSFET 601 and a second MOSFET 603. The light-receiving circuit 600 also includes a third MOSFET 605 that controls the first MOSFET 601, a first light-receiving element 611 that controls the third MOSFET 605, and a second light-receiving element 613 that controls the second MOSFET 603.

The first MOSFET 601 is an enhancement-type n-channel MOSFET, of which the source is connected to the ground and the drain is connected to the source of the second MOSFET 603. The second MOSFET 603 is a depletion-type n-channel MOSFET, of which the drain is connected to a power supply terminal Vdd.

A resistor R17 that serves as a first discharge path is provided between the gate and the source of the first MOSFET 601. Moreover, a resistor R18 that serves a second discharge path is provided between the gate and the source of the second MOSFET 603.

The anode of the first light-receiving element 611 is connected to the ground terminal, and the cathode of the first light-receiving element 611 is connected to the gate of the third MOSFET 605. The third MOSFET is an enhancement-type p-channel MOSFET, of which the source is connected to the power supply terminal Vdd. The drain of the third MOSFET 605 is connected to the gate of the first MOSFET 601. A resistor R16 that serves as a fifth discharge path is provided between the gate and the source of the third MOSFET 605.

The anode of the second light-receiving element 613 is connected to the ground terminal, and the cathode of the second light-receiving element 613 is connected to the gate of the second MOSFET 603.

In the light-receiving circuit 600, the first light-receiving element 611 operates in the PD mode and controls the turning ON/OFF of the third MOSFET 605. The second light-receiving element 613 also operates in the photovoltaic mode and controls the turning ON/OFF of the second MOSFET 603.

Next, the operation of the light-receiving circuit 600 will be described.

First, while there is no light illumination, no photocurrent flows in the first light-receiving element 611, and no current flows through the resistor R16. Thus, the gate-source voltage $V_{GS3}$ of the third MOSFET 605 is 0 V, and the third MOSFET 605 is in the OFF state. Moreover, the gate voltage of the first MOSFET 601 does not increase, the gate-source voltage $V_{GS1}$ of the first MOSFET 601 is 0 V, and the first MOSFET 601 is in the OFF state. No photovoltaic power is generated in the second light-receiving element 613, the gate-source voltage $V_{GS2}$ of the second MOSFET 603 is 0 V, and the second MOSFET 603 is in the ON state.

The output voltage $V_{OUT}$ at the connection point between the first MOSFETs 601 and second MOSFETs 603 becomes the H level (=Vdd).

On the other hand, when there is light illumination, since a photocurrent flows in the first light-receiving element 611, the gate voltage of the third MOSFET 605 decreases due to a voltage drop across the resistor R16. Moreover, when the gate-source voltage $V_{GS3}$ of the third MOSFET 605 becomes lower than the threshold voltage $V_{TH}$, the third MOSFET 605 enters into the ON state. Thus, when the gate voltage of the first MOSFET 601 increases so that the gate-source voltage $V_{GS1}$ becomes positive, the first MOSFET 601 enters into the ON state. At the same time, photovoltaic power is generated in the second light-receiving element 613, a photovoltaic voltage $V_{BE}$ is generated between the anode and the cathode of the second light-receiving element 613. Thus, when the gate voltage of the second MOSFET 603 decreases so that the gate-source voltage $V_{GS2}$ becomes negative, the second MOSFET 603 enters into the OFF state. Moreover, the output voltage $V_{OUT}$ is inverted to the L level (=0 V).

When light illumination disappears, the third MOSFET 605 enters into the OFF state, and charges collected between the gate and the source of the first MOSFET 601 are discharged through the resistor R17. Thus, the gate-source voltage $V_{GS1}$ becomes 0 V, and the first MOSFET 601 enters into the OFF state. When the photovoltaic power of the second light-receiving element 613 disappears, the charges collected between the gate and the source of the second MOSFET 603 are discharged through the resistor R18, and the gate-source voltage $V_{GS2}$ decreases. As a result, the second MOSFET 603 enters into the ON state.

Table 3 indicates the above operation state.

TABLE 3

| | Enhancement | | | | Depletion | | |
|---|---|---|---|---|---|---|---|
| | MOSFET605 | | MOSFET601 | | MOSFET603 | | |
| Light | $V_{GS3}$ | State | $V_{GS1}$ | State | $V_{GS2}$ | State | $V_{OUT}$ |
| ON | Negative | ON | Positive | ON | Negative | OFF | L |
| OFF | 0 | OFF | 0 | OFF | 0 | ON | H |

In the embodiment, when light illumination starts, a static current flows, since a current path is formed between the power supply terminal Vdd and the ground terminal via the third MOSFET 605 and the resistor R17. However, when there is no light illumination, no current path is formed between the power supply terminal Vdd and the ground terminal. Therefore, the static current is suppressed, reducing average power consumption during the operation.

Figure 14:
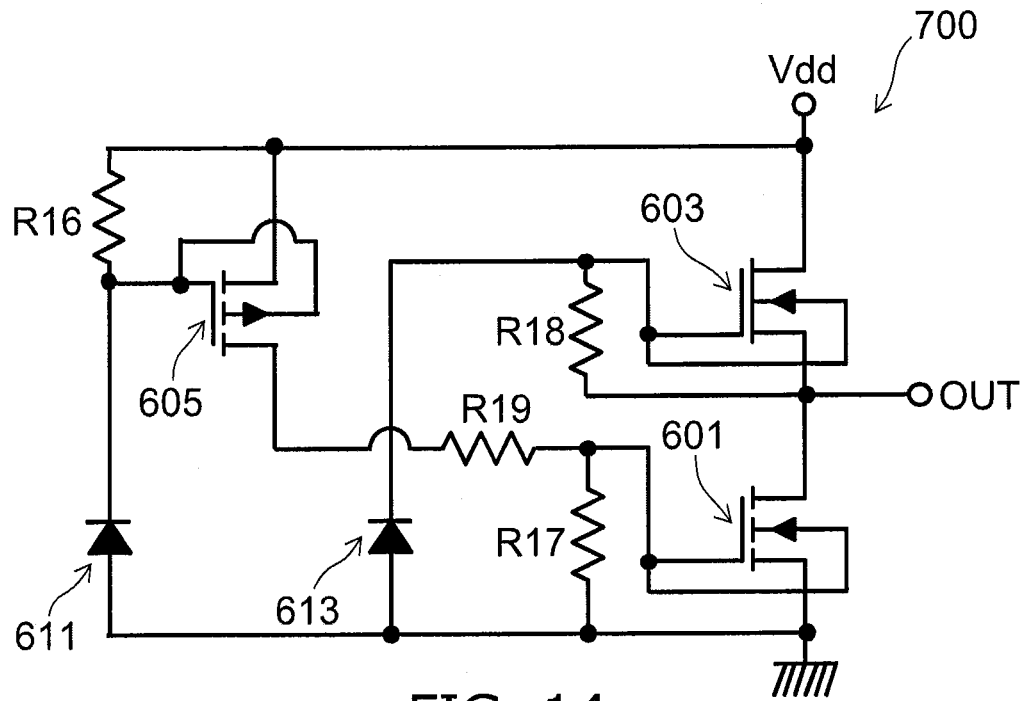
FIG. 14 is a circuit diagram illustrating a light-receiving circuit according to a variation of the eighth embodiment.

FIG. 14 is a circuit diagram illustrating a light-receiving circuit 700 according to a variation of the eighth embodiment. In the light-receiving circuit 700, the cathode of the first light-receiving element 611 is connected to the gate and the back-gate of the third MOSFET 605. Moreover, a resistor R19 is inserted between the drain of the third MOSFET 605 and the gate of the first MOSFET 601. The drain of the third MOSFET 605 is also connected to the back-gate of the first MOSFET 601 through the resistor R19. Further, the cathode of the second light-receiving element 613 is connected to the gate and the back-gate of the second MOSFET 603.

The operation of the light-receiving circuit 700 is the same as the operation of the light-receiving circuit 600 in Table 3. However, the threshold voltage $V_{TH}$ decreases due to a voltage applied to the back-gate of each of the first, second, and third MOSFETs 601, 603, and 605. Thus, it is possible to easily control the turning ON/OFF of the respective MOSFETs. Even when the photovoltaic voltage $V_{BE}$ of the second light-receiving element 613 is smaller than the absolute value of the threshold voltage $V_{TH}$ of the second MOSFET 603, it is possible to control the turning ON/OFF of the second MOSFET 603.

Further, since the resistor R19 is inserted between the drain of the third MOSFET 605 and the gate of the first MOSFET 601, the gate voltage of the first MOSFET 601 decreases. Therefore, when light illumination disappears, charges collected between the gate and the source of the first MOSFET 601 can be immediately discharged through the resistor R17. That is, the transition from the ON state to the OFF state of the first MOSFET 601 is faster than that of the light-receiving circuit 600. Moreover, it becomes possible to accelerate the switching speed of the output voltage $V_{OUT}$ from the L level to the H level.

Ninth Embodiment

Figure 15:
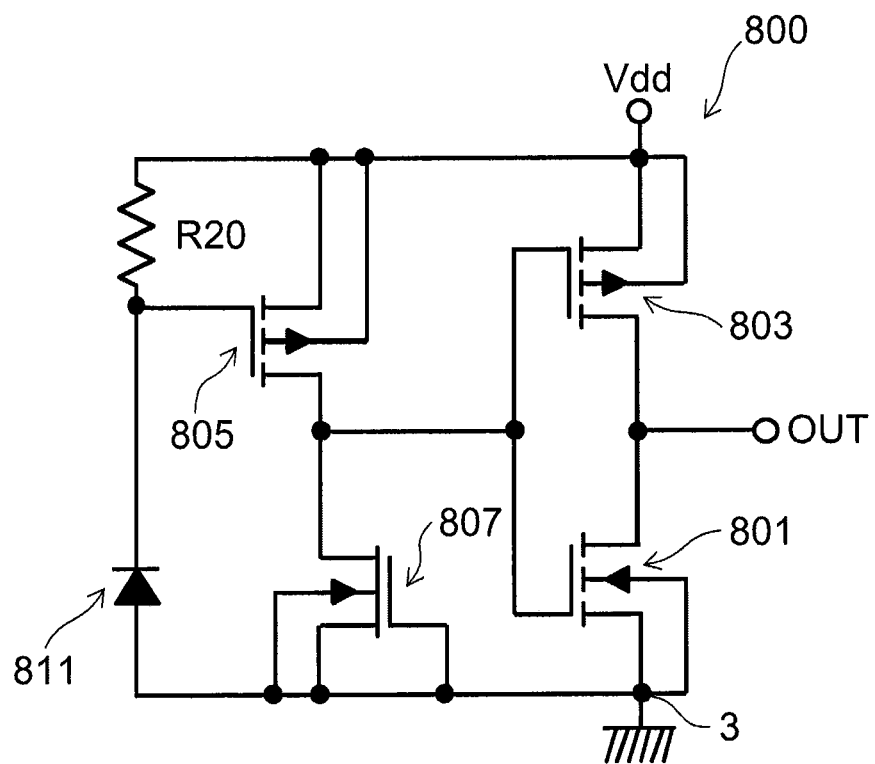
FIG. 15 is a circuit diagram illustrating a light-receiving circuit according to a ninth embodiment.

FIG. 15 is a circuit diagram illustrating a light-receiving circuit 800 according to the ninth embodiment. The light-receiving circuit 800 includes an output stage, which includes a first MOSFET 801 and a second MOSFET 803. Moreover, the light-receiving circuit 800 includes a third MOSFET 805 that controls the first and second MOSFETs 801 and 803 and a first light-receiving element 811 that controls the third MOSFET 805.

The first MOSFET 801 is an enhancement-type n-channel MOSFET, of which the source is connected to the ground terminal and the drain is connected to the drain of the second MOSFET 803. The second MOSFET 803 is an enhancement-type p-channel MOSFET, of which the source is connected to a power supply terminal Vdd.

The anode of the first light-receiving element 811 is connected to the ground terminal 3, and the cathode of the first light-receiving element 811 is connected to the gate of the third MOSFET 805.

The third MOSFET 805 is an enhancement-type p-channel MOSFET, of which the source is connected to the power supply terminal Vdd. Moreover, the drain of the third MOSFET 805 is connected to the gates of the first and second MOSFETs 801 and 803. Moreover, the drain of the third MOSFET 805 is connected to the ground terminal 3 through a depletion-type n-channel MOSFET 807. The gate and the source of the MOSFET 807 are shorted, and the MOSFET 807 is always in the ON state. A resistor R20 that serves as a fifth discharge path is provided between the gate and the source of the third MOSFET 805.

In the light-receiving circuit 800, the first light-receiving element 811 operates in the PD mode, and a photocurrent flows in the first light-receiving element 811 while there is light illumination. Therefore, a voltage drop occurs in the resistor R20, the gate voltage of the third MOSFET 805 decreases, and the third MOSFET 805 is in the ON state. Moreover, when a drain current $I_{D1}$ of the third MOSFET 805 and a drain current $I_{D2}$ of the MOSFET 807 satisfy the following equation (3), the gate voltage of each of the first and second MOSFETs 801 and 803 increases.

$$I_{D1} > I_{D2} \qquad (3)$$

Therefore, the gate-source voltage $V_{GS1}$ of the first MOSFET 801 becomes positive, and the first MOSFET 801 enters into the ON state. On the other hand, the gate-source voltage $V_{GS2}$ of the second MOSFET 803 approaches 0 V, and the second MOSFET 803 enters into the OFF state. Thus, the output voltage $V_{OUT}$ between the first and second MOSFETs 801 and 803 becomes the L level (=0 V).

While there is no light illumination, since a photocurrent does not flow in the first light-receiving element 811, a voltage drop does not occur in the resistor R20. Thus, the gate-source voltage $V_{GS3}$ of the third MOSFET 805 is 0 V, and the third MOSFET 805 is into the OFF state. Since the MOSFET 807 is always in the ON state, the gate voltage of each of the first and second MOSFETs 801 and 803 decreases. Therefore, the gate-source voltage $V_{GS1}$ of the first MOSFET 801 is 0 V, and the first MOSFET 801 is in the OFF state. On the other hand, the gate-source voltage $V_{GS2}$ of the second MOSFET 803 is negative, and the second MOSFET 801 is in the ON state. Therefore, the output voltage $V_{OUT}$ is the H level (=Vdd).

Table 4 indicates the operation of the light-receiving circuit 800.

TABLE 4

| | Depletion | | Enhancement | | | | | | |
| --- | --- | --- | --- | --- | --- | --- | --- | --- | --- |
| | MOSFET807 | | MOSFET805 | | MOSFET801 | | MOSFET803 | | |
| Light | $V_{GS}$ | State | $V_{GS3}$ | State | $V_{GS1}$ | State | $V_{GS2}$ | State | $V_{OUT}$ |
| ON | 0 | ON | Negative | ON | Positive | ON | 0 | OFF | L |
| OFF | 0 | ON | 0 | OFF | 0 | OFF | Negative | ON | H |

In the embodiment, the first light-receiving element 811 operates in the PD mode, and controls the turning ON/OFF of the first and second MOSFETs 801 and 803. Thus, the light-receiving circuit 800 operates at a high speed. That is, since the junction capacitance in the PD mode where a reverse bias is applied is smaller than that of the photovoltaic mode, the operation speed in the PD mode is faster than that in the photovoltaic mode. Moreover, it is possible to reduce power consumption by making the first and second MOSFETs 801 and 803 operate as the CMOS inverter.

While the first to ninth embodiments have been described, embodiments are not limited thereto. For example, as shown in the sixth embodiment, each of the resistors that serve as the discharge paths may be replaced by a depletion-type MOSFET.

Tenth Embodiment

Figure 16A:
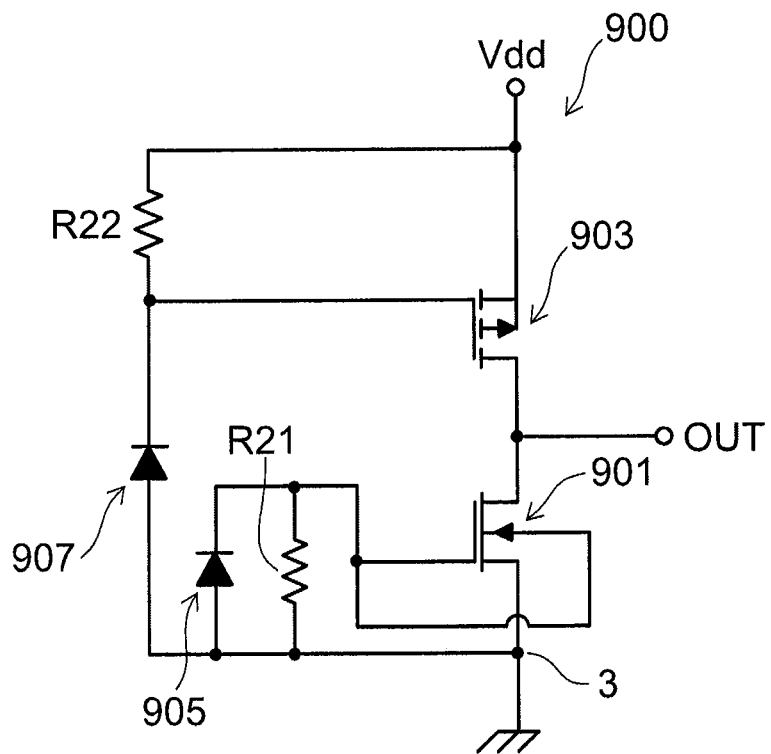
FIGS. 16A and 16B are circuit diagrams illustrating a light-receiving circuit according to a tenth embodiment.

FIG. 16A is a circuit diagram illustrating a light-receiving circuit 900 according to the tenth embodiment. As illustrated in FIG. 16A, the light-receiving circuit 900 includes an output stage, which includes a first MOSFET 901 and a second MOSFET 903, a first light-receiving element 905, and a second light-receiving element 907.

In the output stage at which the first MOSFET 901 is connected in series to the second MOSFET 903, high and low voltages are alternately output at the connection point between the first MOSFET 901 and the second MOSFET 903.

The first MOSFET 901 is a depletion-type n-channel MOSFET, of which the source is connected to a first power supply (e.g. the ground terminal 3). The second MOSFET 903 is an enhancement-type p-channel MOSFET, of which the source is connected to a second power supply (Vdd).

Moreover, the drain of the first MOSFET 901 and the drain of the second MOSFET 903 are connected, and the connection point is an output node.

The anode of the first light-receiving element 905 is connected to the first power supply (the ground terminal 3) and the cathode of the first light-receiving element 905 is connected to the gate and the back-gate of the first MOSFET 901. On the other hand, the anode of the second light-receiving element 907 is connected to the first power supply (the ground terminal 3), and the cathode of the second light-receiving element 907 is connected to the gate of the second MOSFET 903.

Further, a resistor R21 that serves as a first discharge path (load circuit) is provided between the gate and the source of the first MOSFET 901. Moreover, a resistor R22 that serves as a second discharge path (load circuit) is provided between the gate and the source of the second MOSFET 903.

In the embodiment, the first light-receiving element 905 operates in the photovoltaic mode and supplies a photovoltaic voltage to the gate and the back-gate of the first MOSFET 901. Therefore, even when the photovoltaic power $|V_{BE}|$ of the first light-receiving element 905 is smaller than the threshold voltage $|V_{TH}|$ of the first MOSFET 903, it is possible to control the turning ON/OFF of the first MOSFET 903. The second light-receiving element 907 operates in the PD mode and controls ON/OFF connections between the gate of the second MOSFET 903 and the ground terminal 3.

Next, the operation of the light-receiving circuit 900 will be described. First, while there is no light illumination, no photovoltaic power is generated in the first light-receiving element 905, and the gate-source voltage $V_{GS1}$ of the first MOSFET 901 is 0 (zero) V. Thus, the first depletion-type MOSFET 901 is in the ON state. On the other hand, the second light-receiving element 207 is in the OFF state, and the power supply voltage Vdd is applied to the gate of the second MOSFET 903 through the resistor R22. Thus, the second MOSFET 903 is in the OFF state. Therefore, the output voltage $V_{OUT}$ between the first and second MOSFETs 901 and 903 becomes the L level (=0 V).

On the other hand, when there is light illumination, photovoltaic power is generated in the first light-receiving element 905, and a negative voltage is applied to the gate and the back-gate of the first MOSFET 901. Therefore, the first MOSFET 901 enters into the OFF state. At the same time, a photocurrent flows in the second light-receiving element 907, and the connection between the second MOSFET 903 and the ground terminal 3 enters into the ON state. Therefore, the gate voltage decreases, and the second MOSFET 903 enters into the ON state. Thereby, the output voltage $V_{OUT}$ becomes the H level (=Vdd).

When light illumination disappears, charges collected between the gate and the source of the second MOSFET 903 are discharged through the discharge resistor R22. Charges collected between the gate and the source of the first MOSFET 901 are also discharged through the discharge resistor R21.

As above, in the embodiment, the first light-receiving element 905 operates in the photovoltaic mode and controls the turning ON/OFF of the first depletion-type MOSFET 901. Moreover, in order to turn ON the first MOSFET 901, the gate voltage may be changed from 0 V to a negative voltage (approximately −0.7 V).

In contrast, for example, in a light-receiving circuit 300 illustrated in FIG. 10, since the second depletion-type MOSFET 303 is disposed on a side close to the second power supply (Vdd). Therefore, it is necessary to change the gate voltage from Vdd to a negative voltage (approximately −0.7 V) in order to turn OFF the second MOSFET 303. Thus, the gate voltage varies with the large amplitude, and thereby the response speed decreases.

That is, in the embodiment, it is possible to increase the response speed by disposing the first depletion-type MOSFET 901 on a side close to the first power supply (the ground terminal 3).

Figure 16B:
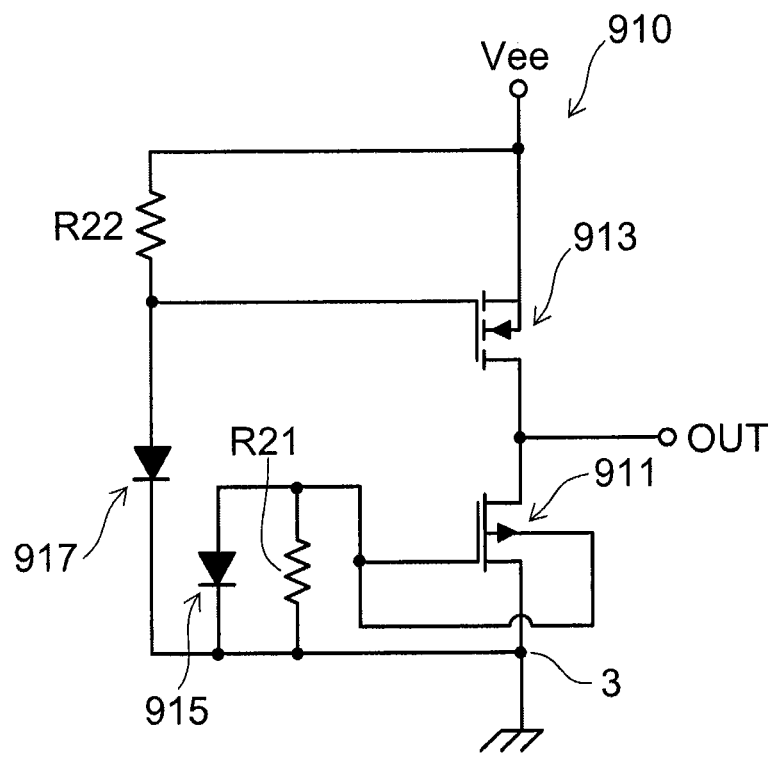

FIG. 16B is a circuit diagram illustrating a light-receiving circuit 910 according to a variation of the tenth embodiment. In the light-receiving circuit 910, a depletion-type p-channel MOSFET is disposed as a first MOSFET 911, and an enhancement-type n-channel MOSFET is disposed as a second MOSFET 913.

The source of the first MOSFET 911 is connected to a first power supply (the ground terminal 3). The source of the second MOSFET 913 is connected to a second power supply (Vee). The cathode of the first light-receiving element 915 is connected to the first power supply (the ground terminal 3), and the anode of the first light-receiving element 915 is connected to the gate and the back-gate of the first MOSFET 911. The cathode of the second light-receiving element 917 is connected to the first power supply (the ground terminal 3), and the anode of the second light-receiving element 917 is connected to the gate of the second MOSFET 913.

In the embodiment, the first light-receiving element 915 receives a light signal, generates photovoltaic power, and controls the turning ON/OFF of the first MOSFET 911. The second light-receiving element 917 controls ON/OFF connections between the gate of the second MOSFET 913 and the first power supply (the ground terminal 3).

In the light-receiving circuit 910, when there is no light illumination, no photovoltaic power is generated in the first light-receiving element 915, and the first MOSFET 911 is in the ON state. On the other hand, since the second light-receiving element 917 is in the OFF state, Vee is applied to the gate of the second MOSFET 913 so that the second MOSFET 913 enters into the OFF state. In this case, since the second power supply is a negative power supply Vee, the output voltage becomes the H level (=0 V).

When there is light illumination, positive photovoltaic power is generated in the first light-receiving element 915 and is applied to the gate and the back-gate of the first MOSFET 911. As a result, the first MOSFET 911 is turned OFF. On the other hand, in the second MOSFET 913, the second light-receiving element is turned ON, whereby the gate voltage of the second MOSFET 913 increases, and the second MOSFET 913 enters into the ON state. Therefore, the output voltage $V_{OUT}$ is inverted to the L level (=Vee).

As above, in the light-receiving circuit 910, the first light-receiving element 915 operates in the photovoltaic mode and controls the turning ON/OFF of the first depletion-type MOSFET 911. Moreover, the second light-receiving element 917 operates in the PD mode and controls the turning ON/OFF of the second MOSFET 913. Since the amplitude of the gate voltage that turns ON the first MOSFET 911 is small, it is possible to increase the response speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light-receiving circuit comprising:
   a first MOSFET having a source, a drain, a gate and a back-gate;
   a first light-receiving element including a first terminal having a first polarity and a second terminal having a second polarity opposite to the first polarity, the first terminal of the first light-receiving element connected to the gate of the first MOSFET, so as to apply a first voltage, which is induced by a light signal incident on the first light-receiving element, to the gate of the first MOSFET, the second terminal of the first light-receiving element being directly connected to the source of the first MOSFET; and
   a second light-receiving element including a first terminal having the first polarity and a second terminal having the second polarity, the first terminal of the second light-receiving element connected to the back-gate of the first MOSFET, so as to apply a second voltage, which is induced by the light signal incident on the second light-receiving element, to the back-gate of the first MOSFET, the second terminal of the second light receiving element being directly connected to the source of the first MOSFET.

2. The circuit according to claim 1, wherein
   the second light-receiving element is configured to change the threshold voltage of the first MOSFET by applying the second voltage to the back-gate of the first MOSFET.

3. The circuit according to claim 1, further comprising:
   a first discharge path provided between the gate and the source of the first MOSFET; and
   a second discharge path provided between the back-gate and the source of the first MOSFET.

4. The circuit according to claim 1, further comprising:
   a second MOSFET connected in series with the first MOSFET, and having a source, a drain, a gate and a back-gate, wherein
   a connection point between the first MOSFET and the second MOSFET is configured to supply an output voltage that alternates between a high level and a low level.

5. The circuit according to claim 4, wherein
   the first MOSFET is a depletion-type FET, and
   the drain of the first MOSFET is connected to the drain of the second MOSFET.

6. The circuit according to claim 4, further comprising
   a third light-receiving element including a first terminal of the first polarity and a second terminal of the second polarity, the second terminal of the third light-receiving element connected to the gate of the second MOSFET, so as to apply a third voltage, which is induced by the light signal incident on the third light receiving element, to the gate of the second MOSFET; and
   a fourth light-receiving element including a first terminal of the first polarity and a second terminal of the second polarity, the second terminal of the fourth light-receiving element connected to the back-gate of the second MOSFET, so as to apply a fourth voltage, which is induced by the light signal incident on the fourth light receiving element, to the back gate of the second MOSFET.

7. A light-receiving circuit comprising:
   an output stage including a first MOSFET and a second MOSFET connected in series with the first MOSFET, the output stage configured to alternately output an output voltage at high and low levels at a connection point between the first MOSFET and the second MOSFET, each of the first MOSFET and the second MOSFET having a source, a drain, a gate and a back-gate;
   a first light-receiving element including a first terminal of a first polarity and a second terminal of a second polarity opposite to the first polarity, the first terminal of the first light-receiving element connected to the gate and the back-gate of the first MOSFET, so as to apply a first voltage, which is induced by a light signal incident on the first light receiving element, to the gate of the first MOSFET and the back-gate of the first MOSFET;
   a second light-receiving element including a first terminal of the first polarity and a second terminal of the second polarity, the first terminal of the second light-receiving element connected to the gate of the second MOSFET, so as to apply a second voltage, which is induced by the light signal incident on the second light receiving element, to the gate of the second MOSFET.

8. The circuit according to claim 7, wherein
   at least one of the first light-receiving element and the second light-receiving element operates in a photovoltaic mode.

9. The circuit according to claim 7, further comprising:
   a first discharge path provided between the gate of the first MOSFET and the source of the first MOSFET; and
   a second discharge path provided between the gate of the second MOSFET and the source of the second MOSFET.

10. The circuit according to claim 7, wherein
    one of the first MOSFET and the second MOSFET is an enhancement-type FET, and the other is a depletion-type FET.

11. A light-receiving circuit comprising:
    a first MOSFET having a source, a drain, a gate and a back-gate; and
    a first light-receiving element including a first terminal of a first polarity and a second terminal of a second polarity opposite to the first polarity, the first terminal of the first light-receiving element connected to the gate and the back-gate of the first MOSFET, so as to apply a first voltage, which is induced by a light signal incident on the first light-receiving element, to the gate and the back-gate of the first MOSFET.

12. The circuit according to claim 11, further comprising:
    a second MOSFET connected in series with the first MOSFET, the second MOSFET having a source, a drain, a gate, and a back-gate, wherein
    a connection point between the first MOSFET and the second MOSFET at which outputs voltages of high and low levels are alternately output.

13. The circuit according to claim 12, wherein
    the first terminal of the first light-receiving element is electrically connected to a gate of the second MOSFET; and
    the first light-receiving element is configured to apply the first voltage to the gate of the second MOSFET.

14. The circuit according to claim 12, further comprising:
    a third MOSFET having a source, a drain, a gate and a back-gate, the drain of the third MOSFET being electrically connected to the gate and the back-gate of the second MOSFET; and
    a second light-receiving element including a first terminal of a first polarity and a second terminal of a second polarity opposite to the first polarity, the second terminal of the first light-receiving element connected to the gate and the back-gate of the third MOSFET.

* * * * *